(12) United States Patent
Kim et al.

(10) Patent No.: US 8,448,052 B2
(45) Date of Patent: May 21, 2013

(54) METHOD FOR DATA RATE MATCHING

(75) Inventors: So Yeon Kim, Gyeonggi-do (KR); Min Seok Oh, Gyeonggi-do (KR); Seung Hyun Kang, Gyeonggi-do (KR); Ji Ae Seok, Gyeonggi-do (KR); Ji Wook Chung, Gyeonggi-do (KR); Young Seob Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 672 days.

(21) Appl. No.: 12/665,582

(22) PCT Filed: Jun. 20, 2008

(86) PCT No.: PCT/KR2008/003539
§ 371 (c)(1),
(2), (4) Date: Jan. 7, 2010

(87) PCT Pub. No.: WO2008/156341
PCT Pub. Date: Dec. 24, 2008

(65) Prior Publication Data
US 2010/0189187 A1    Jul. 29, 2010

Related U.S. Application Data

(60) Provisional application No. 60/945,110, filed on Jun. 20, 2007.

(30) Foreign Application Priority Data

Oct. 1, 2007 (KR) .......................... 10-2007-0098758

(51) Int. Cl.
*H03M 13/23* (2006.01)
*H03M 13/33* (2006.01)

(52) U.S. Cl.
USPC ........................................... 714/790; 714/800

(58) Field of Classification Search
None
See application file for complete search history.

(56) References Cited

U.S. PATENT DOCUMENTS

| 6,898,743 | B2 | 5/2005 | Yoon et al. | |
|---|---|---|---|---|
| 2002/0085659 | A1* | 7/2002 | Kim et al. | 375/377 |
| 2005/0100085 | A1 | 5/2005 | Dottling et al. | |

FOREIGN PATENT DOCUMENTS

| KR | 2002-003766 A | 1/2002 |
|---|---|---|
| KR | 10-2004-0077967 A | 9/2004 |
| KR | 10-2005-0098981 A | 10/2005 |
| WO | WO-2004/062113 A1 | 7/2004 |

* cited by examiner

*Primary Examiner* — Ajay Bhatia
*Assistant Examiner* — Dipakkumar Gandhi
(74) *Attorney, Agent, or Firm* — Birch, Stewart, Kolasch & Birch, LLP

(57) ABSTRACT

A data rate matching method is disclosed. More particularly, a rate matching method using at least two parameters is disclosed. The rate matching method includes selecting bits from an input bitstream using a primary-indication parameter for selecting at least one bit and a secondary indication parameter for canceling the selection using the primary indication parameter or additionally selecting unselected bits, and processing the selected bits according to a rate matching mode so as to generate an output bitstream. By using the rate matching method, high ¬ speed processing is realized by a simple calculation and the locations of target bits can be efficiently decided using at least two indication parameters. Accordingly, it is possible to reduce a calculation amount or improve performance.

3 Claims, 5 Drawing Sheets

METHOD FOR DATA RATE MATCHING

This application is the National Phase of PCT/KR2008/003539 filed on Jun. 20, 2008, which claims priority under 35 U.S.C. §119(e) to U.S. Provisional Application No. 60/945,110 filed on Jun. 20, 2007 and under 35 U.S.C. §119(a) to Patent Application No. 10-2007-0098758 filed in Republic of Korea on Oct. 1, 2007, all of which are hereby incorporated by reference into the present application.

TECHNICAL FIELD

The present invention relates to a data rate matching method, and more particularly, to a rate matching method of using at least two parameters.

BACKGROUND ART

In a mobile communication system, when a signal transmitted from a transmitter is received via a wireless network, it is impossible to receive the signal which is not mixed with distortion or noise. Accordingly, various methods for solving such a problem have been suggested and a representative example thereof includes an error control coding method. In a CDMA mobile communication system which is one type of the mobile communication system, for example, a turbo code and a convolutional code are used as the error control coding method.

That is, channel coding may be used to correct an error generated in a process of transmitting data. At this time, parity data is generated in addition to information to be transmitted. Error correction capability of a channel coded code is improved as a ratio of parity data to the information to be transmitted is increased. That is, as a code rate of a transmitted bitstream is decreased, error recovery performance is improved.

However, if the code rate is decreased, the ratio of parity data to the information to be transmitted is increased and thus transmission efficiency is decreased in the communication system using a restricted resource. Accordingly, there is a need for a rate matching method which is capable of flexibly matching a code rate according to a communication state.

In the UMTS standard defined by the 3rd Generation Project Partnership (3GPP) in Release '99, rate matching is performed with respect to code bits outputted after channel coding. Mostly, the number of code bits outputted after channel coding is not matched with the total number of bits in a wireless transmission unit (TU). The rate matching indicates an operation for performing repetition or puncturing with respect to the code bits and matching the number of code bits with the total number of bits in the wireless TU. The rate matching may be used in various standards such as the High Speed Downlink Packet Access (HSDPA) standard.

DISCLOSURE

Technical Problem

An object of the present invention devised to solve the problem lies on a rate matching method using at least two indication parameters.

Another object of the present invention devised to solve the problem lies on a method of deciding at least two indication parameter values used for performing rate matching.

Technical Solution

The object of the present invention can be achieved by providing a rate matching method including: selecting bits from an input bitstream using a primary indication parameter for selecting at least one bit and a secondary indication parameter for canceling the selection using the primary indication parameter or additionally selecting unselected bits; and processing the selected bits according to a rate matching mode so as to generate an output bitstream.

In another aspect of the present invention, provided herein is a rate matching method in a system including a rate matching block to which a predetermined input bitstream is inputted, the method including: specifying at least one bit location using at least two indication parameters with respect to the input bitstream; and puncturing or repeating the bit located at the specified location according to the rate matching mode.

The primary indication parameter and the secondary indication parameter may be decided in consideration of at least one of the bit number of the input bitstream and the bit number of the output bitstream. The secondary indication parameter may be determined on the basis of the primary indication parameter.

The primary indication parameter and the secondary indication parameter may indicate selection periods. A secondary indication mode may be used to indicate one of the selection of the bits and the cancellation of the selection using the secondary indication parameter.

The rate matching mode may be a puncturing mode if the size of the input bitstream is larger than that of the output bitstream and may be a repetition mode if the size of the input bitstream is smaller than that of the output bitstream.

Advantageous Effects

By a rate matching method disclosed in the present specification, it is possible to perform rate matching by a simple efficient method. By deciding locations or target bits in an input bitstream using a simple counter or conditional statement and performing puncturing or repetition with respect to the target bits, it is possible to realize high-speed processing by a simple calculation. In addition, it is possible to efficiently decide the locations using two or more indication parameters. Accordingly, it is possible to reduce a calculation amount at the time of puncturing or repetition or obtain more excellent performance.

In particular, it is easy to apply the rate matching method according to the present invention to the various sizes of an input bitstream or various code rates, compared with the case where a code rate is matched by performing puncturing or repetition using a constant pattern. In order to apply the rate matching method according to the present invention to various cases, puncturing or repetition can be performed by a combination of simple equations or algorithms. Thus, it is possible to decrease complexity of rate matching.

DESCRIPTION OF DRAWINGS

The accompanying drawings, which are included to provide a further understanding of the invention, illustrate embodiments of the invention and together with the description serve to explain the principle of the invention.

In the drawings.

MODE CARRYING OUT THE INVENTIONS

Figure 1:
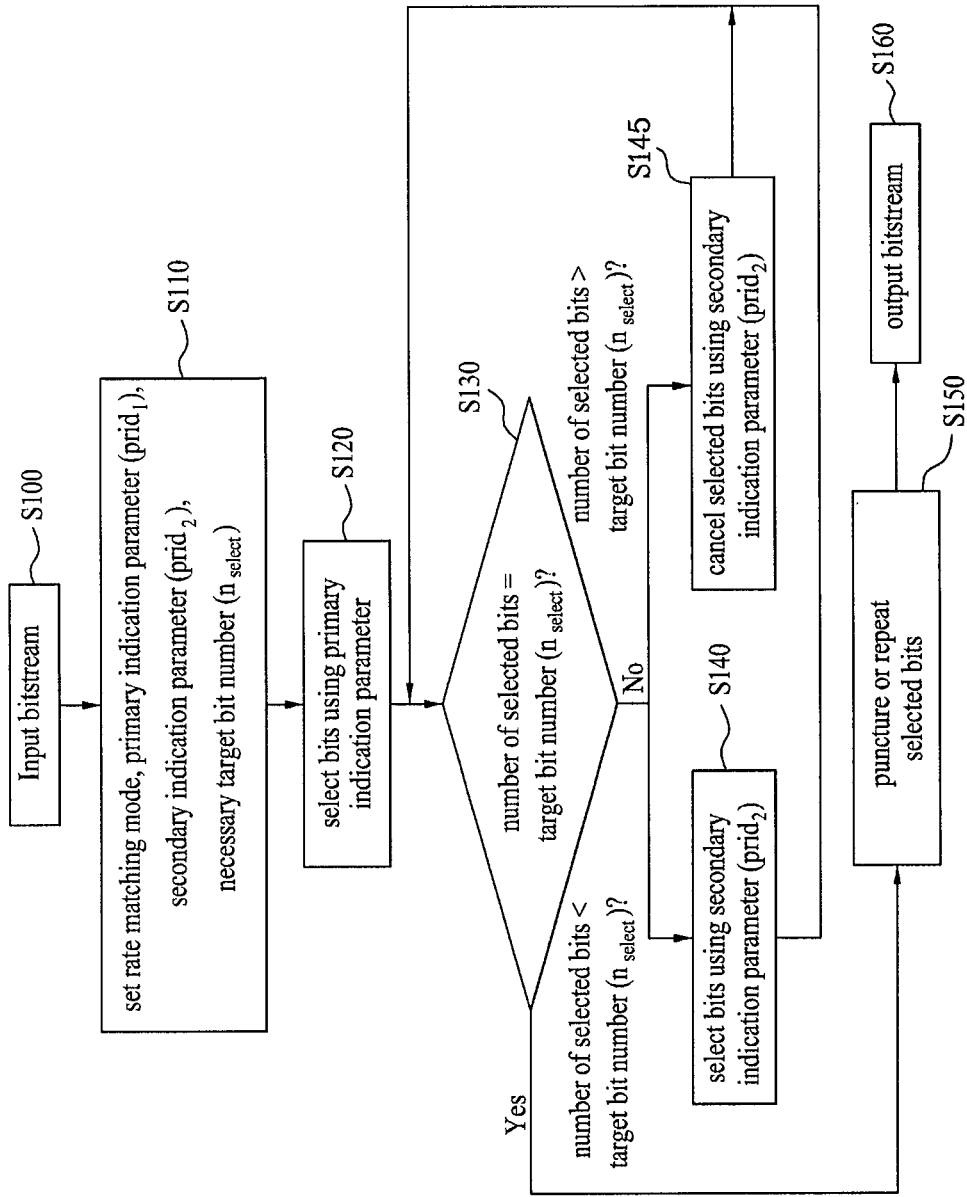
FIG. 1 is a flowchart illustrating a rate matching method using at least two indication parameters according to an embodiment of the present invention.

Reference will now be made in detail to the preferred embodiments of the present invention, examples of which are illustrated in the accompanying drawings. The detailed description set forth below in connection with the appended drawings is intended as a description of exemplary embodiments and is not intended to represent the only embodiments in which the concepts explained in these embodiments can be practiced. The detailed description includes details for the purpose of providing an understanding of the present invention. However, it will be apparent to those skilled in the art that these teachings may be implemented and practiced without these specific details. For example, in the following description, messages and parameters include details such as a structure for achieving the object of the present invention and a type and a length which can be readily implemented by those skilled in the art, but the detailed configuration including the structure for obtaining the effect of the present invention may be modified and used.

In some instances, well-known structures and/or devices are omitted in order to avoid obscuring the concepts of the present invention and the important functions of the structures and/or devices are shown in block diagram form and/or flowchart form. The same reference numbers will be used throughout the drawings to refer to the same or like parts.

The present specification relates to a rate matching method, that is, a method of performing puncturing or repetition with respect to a channel-coded bitstream and generating a bitstream with a code rate to be obtained. Generally, in order to perform the puncturing or repetition with respect to the bitstream, predetermined bits or bit locations of bitstream are selected, the puncturing or repetition is performed with the selected bits, and the size of the bitstream is adjusted. The present specification is characterized in that bits to be punctured or repeated are selected using at least three parameters at the time of rate matching. Hereinafter, for convenience of description, the bits to be punctured or repeated are called target bits.

When the target bits to be punctured or repeated are selected, an indication parameter may be used. That is, the indication parameter value is decided in consideration of at least one of a system state, a coding rate, an input bitstream and an output bitstream. In addition, it is determined which bits of the input bitstream are decided as the target bits according to the decided indication parameter value. Here, the indication parameter may become a selection period value of the input bitstream. For example, if the indication parameter is 3, every third bit is selected from the input bitstream.

According to embodiments disclosed in the present specification, the target bits do not need to be selected so as to obtain the bitstream with a desired code rate by the selection using one parameter. The target bits are selected by the number close to the necessary bitstream size using a primary indication parameter and the result of selecting the bits using the primary indication parameter is corrected using secondary or higher indication parameter such that the bitstream with the desired code rate is accurately generated.

In other words, in consideration of the bits selected using the previous indication parameter or the primary indication parameter, the selected bits are cancelled or unselected bits are additionally selected using the secondary or higher indication parameter, such that the bitstream with the desired code rate is accurately generated. For example, if the number of target bits selected using the primary indication parameter is larger than the number of bits according to the desired code rate, at least one of the selected bits is cancelled using the secondary or higher indication parameter. If the number of target bits selected using the primary indication parameter is smaller than the number of bits according to the desired code rate, at least one of the unselected bits is additionally selected using the secondary or higher indication parameter.

FIG. 1 is a flowchart illustrating a rate matching method using at least two indication parameters according to an embodiment of the present invention.

Hereinafter, a rate matching method of selecting target bits using a plurality of parameters will be described in detail with reference to FIG. 1.

First, in a step S100, a bitstream is inputted. At this time, the bitstream may include bits which are subjected to channel coding. In a step S110, a rate matching mode, a primary indication parameter, a secondary indication parameter and a necessary target bit number are decided in consideration of the size of the input bitstream and the size of an output bitstream.

In a step S120, some of bits included in the input bitstream are selected using the primary indication parameter decided in the step S120. Then, in a step S130, the number of selected bits is compared with the necessary target bit number such that it is determined whether rate matching is accurately performed or correction is necessary. That is, if the number of selected bits is equal to the target bit number, it is determined that the rate matching is accurately performed. Thus, in a step S150, puncturing or repetition is performed with respect to the bits selected using the primary indication parameter.

In contrast, if the number of selected bits is not equal to the target bit number, additional correction of the selected bits is necessary. In more detail, if the number of selected bits is smaller than the target bit number, bits are additionally selected using the secondary indication parameter in a step S140. Then, if the number of selected bits is larger than the target bit number, the bits selected using the primary indication parameter are cancelled using the secondary indication parameter in a step S145. If the number of bits selected in the step S140 or the step S145 is equal to the necessary target bit number, the puncturing or repetition is performed with respect to the bits selected using the primary indication parameter in the step S150.

However, if the number of bits is not equal to the target bit number even in this case, additional correction of the selected bits is necessary. That is, the bits selected in the step S140 or the step S145 may be corrected. If the correction is performed again, third or more indication parameter value may be used instead of the secondary parameter. That is, if the correction of the selected bits is performed n times, an $n+1^{th}$ indication parameter value is defined and bits are selected or the selected bits are cancelled using the $n+1^{th}$ indication parameter.

At least two indication parameters and a basic parameter may be decided and rate matching may be then performed using the decided parameters. Hereinafter, first, an example of a method of setting an initial value such as the parameters described using the step S110 will be described.

An example of the rate matching parameter includes the rate matching mode. That is, the rate matching mode may be divided into a puncturing mode and a repetition mode depending on whether the input bitstream is punctured or repeated. Basically, the repetition mode is set if the number of input bits is smaller than the number of output bits ($L_{input} < L_{output}$) and the puncturing mode is set if the number of input bits is larger than the number of output bits ($L_{input} > L_{output}$). Before or when the rate matching mode is decided, the number of selected target bits and the number of times of repetition of the whole input bitstream may be decided.

Now, the repetition mode will be described in more detail. The whole repetition of the whole input bitstream is first performed in order to obtain the bit number according to a desired code rate, that is, the output bit number. If the output bit number cannot be obtained by the whole repetition, the target bits are selected and only the selected bits are repeated. For example, it is assumed that the bit number of the input bitstream is 12 and the output bit number is 41. In this case, the whole repetition may be performed at least three times. If the whole repetition is performed three times, total 36 bits are generated. Accordingly, in order to obtain the output bit number, five bits are further required. That is, the number of target bits to be selected is 5.

For example, it is assumed that the bit number of the input bitstream is 12 and the output bit number is 43. In this case, the whole repetition may be performed at least three times. At this time, in the case where the repetition mode is applied according to the above-described method, in order to obtain the output bit number, 7 bits are further required. That is, the number of target bits to be selected is 7.

In the case where the number of bits which should be repeated in order to more efficiently perform the rate matching is larger than a half of the input bit number, the rate matching may be performed by performing the whole repetition one more time and setting the rate matching mode to the puncturing mode.

For example, it is assumed that the bit number of the input bitstream is 12 and the output bit number is 43. In this case, if the whole repetition is performed one more time according to the present embodiment, that is, if the whole repetition is performed total four times, total 48 bits are generated. In order to obtain the output bit number, five bits are punctured. That is, the number of target bits to be selected is 5.

That is, in the case where the target bit number is larger than a half of the input bit number, the number of target bits to be selected can be reduced by applying the puncturing mode, compared with the case of applying the repetition mode.

In the puncturing mode, the number of target bits to be selected may be decided by subtracting the bit number of the input bitstream from the bit number according to the desired code rate. Even in this case, if the number of times of the whole repetition should be decided, the number of times of the whole repetition may be fixed to one.

Although the example of setting the two indication parameters is described, it will be apparent that the target bits can be selected by setting three or more indication parameters if necessary.

A method of deciding the primary indication parameter by another rate matching parameter will be described. As described above, the primary indication parameter may be a selection period value. That is, the bits may be selected by the target bit number in a period according to the primary indication parameter, by deciding an integer value corresponding to the value obtained by dividing the total input bit number by the target bit number. If the value obtained by dividing the input bit number by the target bit number is a fraction, the integer value may be decided by various methods such as round, ceil, floor, a maximum integer value which does not exceed a divisor, and a minimum integer value which exceeds a divisor.

A method of deciding the secondary indication parameter as another rate matching parameter will be described. The secondary indication parameter may be a selection period value, similar to the primary indication parameter. The secondary indication parameter is different from the primary indication parameter in that a selection period thereof is preferably set to a value larger than that of the primary indication parameter. The large selection period indicates that the number of bits selected from the restricted input bitstream is reduced.

As an example of deciding the secondary indication parameter, an integer value corresponding to a value obtained by dividing a value, which is obtained by subtracting the number of bits selected using the primary indication parameter from the input bit number, by a value, which is obtained by subtracting the number of bits selected in the primary selection from the necessary target bit number, may be decided as the secondary indication parameter value. That is, if the number of remaining bits which are not selected using the primary indication parameter is divided by a bit number larger or smaller than the necessary target bit number, the approximate selection period of the secondary indication parameter can be acquired.

It may be determined whether or not the correction using the secondary indication parameter is necessary, using the value obtained by subtracting the number of bits selected using the primary indication parameter from the necessary target bit number, and, if it is determined that the correction using the secondary indication parameter is necessary, it may be determined whether the bits are additionally selected or the selection of some of the bits selected using the primary indication parameter is cancelled.

For example, if the value obtained by subtracting the number of bits selected using the primary indication parameter from the necessary target bit number is 0, it is possible to perform the rate matching using only the primary indication parameter without the secondary indication parameter. If the value obtained by subtracting the number of bits selected using the primary indication parameter from the necessary target bit number is larger than 0, some of the bits which are not selected using the primary indication parameter are additionally selected using the secondary indication parameter. If the value obtained by subtracting the number of bits selected using the primary indication parameter from the necessary target bit number is smaller than 0, the selection of the bits selected using the primary indication parameter is cancelled using the secondary indication parameter.

Hereinafter, Table 1 shows the method of deciding the three parameters by an algorithm representation method.

TABLE 1

| Parameter | Syntax |
| --- | --- |
| Mode decision | If $L_{input} < L_{output}$,<br>Mode = Repetition,<br>rpt = $\lfloor L_{output}/L_{input} \rfloor$<br>$n_{select} = L_{output} - L_{input}$*rpt;<br>If $n_{select} > (L_{input}/2)$,<br>Mode = Puncturing,<br>rpt = rpt + 1,<br>$n_{select} = L_{input} - n_{select}$; |

TABLE 1-continued

| Parameter | Syntax |
|---|---|
| First selection period parameter | Otherwise, Mode = Puncturing, rpt = 1, $n_{select} = L_{input} - L_{output}$; $prid_1$ = rounding ($L_{input}/n_{select}$) off to the nearest integer If $prid_1 < 2$, $prid_1 = 2$ |
| Second selection period parameter | $temp_1 = L_{input} - \lfloor L_{input}/prid_1 \rfloor$, $temp_2 = n_{select} - \lfloor L_{input}/prid_1 \rfloor$ $prid_2 = \lfloor temp_1/|temp_2| \rfloor$ If $temp_2 = 0$, use only first selection If $temp_2 > 0$, SIM = Selection Otherwise, SIM = De-selection |

In Table 1, $L_{input}$ denotes the input bit number, $L_{output}$ denotes the output bit number, $n_{select}$ denotes the number of target bits selected for puncturing or repetition, and rpt denotes the number of times of whole repetition of the whole input bitstream. Here, rpt denotes the number of times of repetition if the repetition is performed and more particularly the number of times of addition of a log likelihood ratio (LLR) value. In addition, $prid_1$ denotes the primary indication parameter, $prid_2$ denotes the secondary indication parameter, and SIM denotes the secondary indication mode, that is, information indicating whether the bits are additionally selected or the selected bits are cancelled using the secondary indication parameter.

Hereinafter, a method of selecting the target bits which will be used to perform the rate matching on the basis of the initial parameters set by the above-described method will be described. Similarly, although the example of selecting the target bits using the two indication parameters will be described, it will be apparent that the target bits can be selected using three or more indication parameters, if necessary.

First, as described above, the bits are selected using the primary indication parameter and the selection of the bits using the primary indication parameter is corrected using the secondary indication parameter. That is, if the number of bits selected using the primary indication parameter is smaller than the necessary target bit number, the bits are additionally selected using the secondary indication parameter. If the number of bits selected using the primary indication parameter is larger than the necessary target bit number, some of the selected bits are cancelled using the secondary indication parameter. It may be determined whether the bits are additionally selected using the secondary indication parameter or some of the bits selected using the primary indication parameter are cancelled, as the secondary indication mode. That is, the selection may be decided as the secondary indication mode in the former case and the cancellation of the selection may be decided as the secondary indication mode in the latter case.

For example, a method of selecting the target bits when the secondary indication mode is the selection will be described. First, the bits are selected from the input bitstream in a period according to the primary indication parameter. If the number of bits selected is smaller than the necessary target bit number, the bits are additionally selected from the bits which are not selected using the primary indication parameter in a period according to the secondary indication parameter. The bits are selected until the bits are selected by the necessary target bit number.

For example, a method of selecting the target bits when the secondary indication mode is the cancellation of the selection will be described. First, the bits are selected from the input bitstream in a period according to the primary indication parameter. If the number of bits selected is larger than the necessary target bit number, the selection of the bits is cancelled in a period according to the secondary indication parameter. The selection of the bits is cancelled until the bits are selected by the necessary target bit number.

Figure 2:
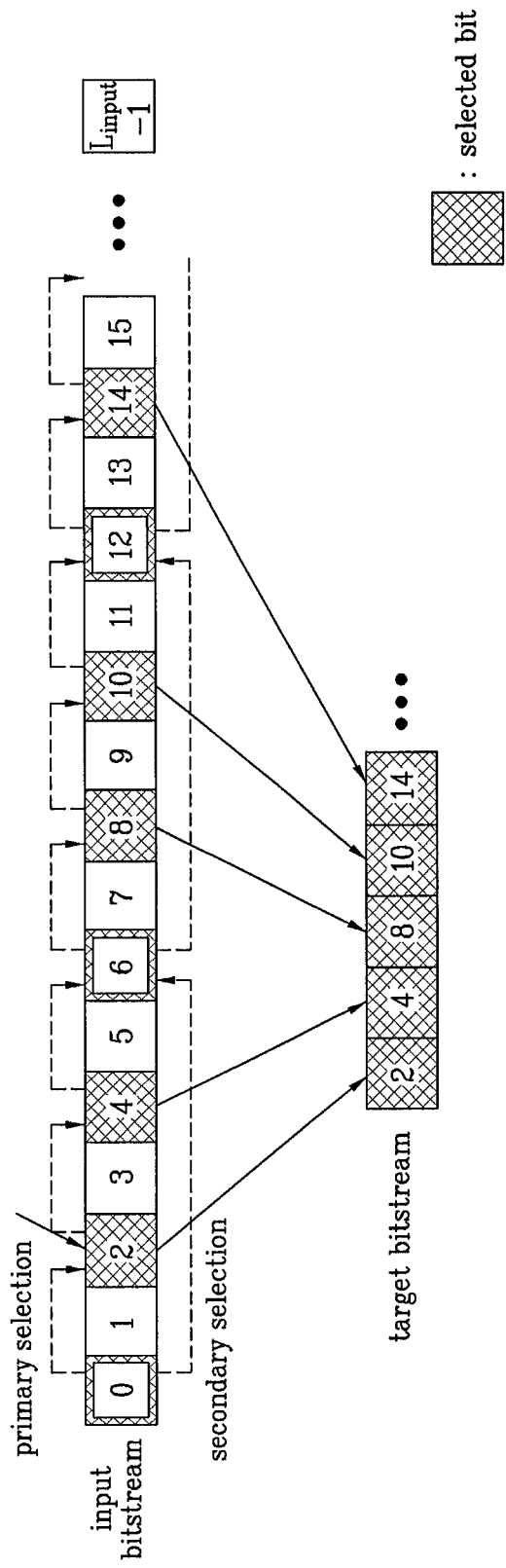
FIG. 2 is a view showing an example of a method of selecting target bits according to an embodiment of the present invention.

FIG. 2 is a view showing an example of a method of selecting target bits according to an embodiment of the present invention.

In FIG. 2, an upper bitstream is the input bitstream and a lower bitstream is the target bitstream selected for rate matching. Referring to FIG. 2, it can be seen that the primary indication parameter value is 2 and every second bit is selected. That is, the indexes of the bits selected by the primary selection are 0, 2, 4, 6, 8, 10, 12, 14 and so on.

If it is assumed that the number of bits selected using the primary indication parameter is larger than the necessary target bit number, some of the bits selected should be cancelled using the secondary indication parameter. Referring to FIG. 2, it can be seen that the secondary indication parameter value is 6 and the selection of every sixth bit is cancelled. That is, the indexes of the bits of which the selection is cancelled by the secondary selection are 0, 6, 12 and so on.

That is, the indexes of the target bits selected finally are 2, 4, 8, 10, 14 and so on as shown in the lower side of FIG. 2. The selected target bits are repeated so as to generate the output bitstream if the rate matching mode is the repetition, and the selected target bits are punctured so as to generate the output bitstream if the rate matching mode is the puncturing.

Another method of selecting the target bits if the secondary indication mode is the cancellation of the selection may be performed by one time of determination, instead of two times of determination. That is, the bits which satisfy the period according to the primary indication parameter and do not correspond to the period according to a product of the primary indication parameter and the secondary indication parameter are selected from the input bitstream by the necessary target bit number.

That is, for convenience of description, although two times of selection including the selection using the primary indication parameter and the selection using the secondary indication parameter are performed in order to realize the present invention, one time of selection may be performed according to how the algorithm or the process is implemented.

From such a viewpoint, referring to FIG. 2 again, the secondary indication parameter value is set to 3 and the bits which satisfy the period according to the primary indication parameter and do not correspond to the period according to a product (6=2*3) of the primary indication parameter (2) and the secondary indication parameter are selected from the input bitstream by the necessary target bit number.

Table 2 shows the methods of deciding the target bits by the algorithm representation method. A first method is performed by two steps, a second method is performed by one step, and a third method is performed by a mixture of the first method and the second method. The results of the three methods are not different from one another in view of performance although there is a slight difference.

TABLE 2

| | |
|---|---|
| Output bit stream generation using 2 selection steps | s = 0, p = 0; // dummy variable for counting |

TABLE 2-continued

| | |
|---|---|
| (The selection using the primary indication parameter and the selection using the secondary indication parameter are sequentially performed) | If (SIM = = Selection)<br>{<br>for (i = 0 ~ $L_{input}$−1)<br>{<br>if (i%$prid_1$ = =0)<br>{<br>select this bit,<br>p = p +1;<br>}<br>else<br>{<br>if (s%$prid_2$= =0 && p<$n_{select}$)<br>{<br>select this bit,<br>p = p + 1;<br>}<br>s = s + 1;<br>}<br>}<br>}<br>Else (SIM = = De-selection)<br>{<br>for (i = 0 ~ $L_{input}$−1)<br>{<br>if (i%$prid_1$ = =0)<br>{<br>select this bit,<br>p = p +1;<br>}<br>else<br>{<br>if (s%$prid_2$= =0 && p<$n_{select}$)<br>{<br>de-select this bit,<br>p = p − 1;<br>}<br>s = s + 1;<br>}<br>}<br>} |
| Output bit stream generation using 1 selection step (The selection is performed in consideration of both the primary indication parameter and the secondary indication parameter) | s = 0, p = 0; // dummy variable for counting<br>If (SIM = = Selection)<br>{<br>for (i = 0 ~ $L_{input}$−1)<br>{<br>if ((i%$prid_1$ = =0 || s%$prid_2$= =0) && p<$n_{select}$)<br>{<br>select this bit,<br>p = p + 1;<br>}<br>s = s + 1 ;<br>}<br>}<br>Else (SIM = = De-selection)<br>{<br>for (i = 0 ~ $L_{input}$−1)<br>{<br>if (i%$prid_1$= =0 && i%($prid_1$*$prid_2$) !=0 && p<$n_{select}$)<br>{<br>select this bit,<br>p = p + 1;<br>}<br>}<br>} |
| Output bit stream generation using 2 selection steps for SIM==Selection and 1 selection step for SIM==De-selection (The selection using the primary indication parameter and the selection using the secondary indication parameter are sequentially performed if the secondary indication mode is the selection mode and the selection is performed in consideration of both the primary indication parameter and the secondary indication parameter if the secondary indication mode is the cancellation of the selection) | s = 0, p = 0; // dummy variable for counting<br>If (SIM = = Selection)<br>{<br>for (i = 0 ~ $L_{input}$−1)<br>{<br>if (i%$prid_1$ = =0)<br>{<br>select this bit, p = p +1;<br>}<br>else<br>{<br>if (s%$prid_2$= =0 && p<$n_{select}$}<br>{<br>select this bit, p = p + 1;<br>}<br>s = s + 1;<br>}<br>}<br>}<br>Else (SIM = = De-selection)<br>{<br>for (i = 0 ~ $L_{input}$−1)<br>{<br>if (i%$prid_1$= =0 && i%($prid_1$*$prid_2$) !=0 && p<$n_{select}$)<br>{<br>select this bit, p = p + 1;<br>}<br>}<br>} |

In Table 2, $L_{input}$ denotes the input bit number, $L_{output}$ denotes the output bit number, $n_{select}$ denotes the number of target bits selected for puncturing or repetition, $prid_1$ denotes the primary indication parameter, $prid_2$ denotes the secondary indication parameter, and SIM denotes the secondary indication mode, similar to Table 1. In addition, i denotes the indexes allocated to the bits of the input bitstream, and s denotes the indexes allocated to the remaining bits of the input bitstream after the primary selection. Here, i may be an integer from 0 to $L_{input}$−1.

The rate matching may be performed using the target bits selected by the above-described method. That is, if the rate matching mode is the repetition mode, the target bits are repeated together with or independent of the whole repetition so as to generate the output bitstream. If the rate matching mode is the puncturing mode, the target bits are cancelled, that is, punctured, so as to generate the output bitstream.

Hereinafter, a rate matching method which is applicable in the case where channel coding is performed with a tail bit convolutional code having a mother code rate of ⅓ will be described as a detailed embodiment of the present invention. At this time, the rate matching may be performed by a separate rate matching module or a simple algorithm added to a channel coding module.

Figure 3:
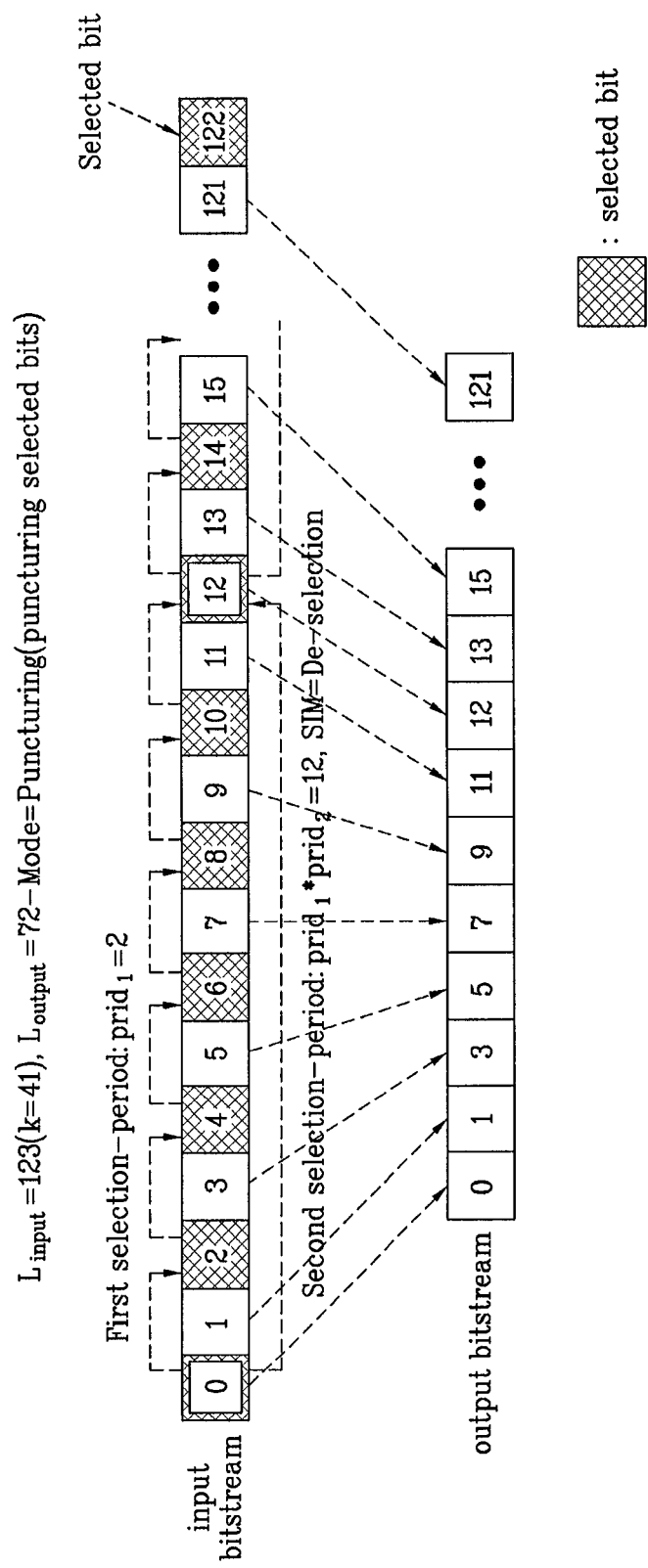
FIG. 3 is a view showing an example of a method of selecting target bits according to an embodiment of the present invention.

FIG. 3 is a view showing an example of a method of selecting target bits according to an embodiment of the present invention.

FIG. 3 shows a method of selecting the target bits which will be used to perform the rate matching in the case where the information bit number is 41, the input bit number $L_{input}$ is 123 (=41*3), and the output bit number $L_{output}$ is 72.

From the above-described parameter values, since the input bit number is larger than the output bit number, the rate matching mode is the puncturing mode. The target bit number $n_{select}$ is a difference between the input bit number and the output bit number ($L_{input}$−$L_{output}$) of 51. Since the primary indication parameter $prid_1$ becomes $$2\left(=\left\lfloor\frac{123}{51}\right\rfloor\right)$$

according to $\left\lfloor\frac{L_{input}}{n_{select}}\right\rfloor$, $temp1 = 123 - \lfloor 123/2 \rfloor = 62$ and $temp2 = 51 - \lfloor 123/2 \rfloor = -10$, the secondary indication parameter $prid_2$ becomes $$\lfloor 62/10 \rfloor = 6.$$

Since the value temp2 is smaller than 0, the secondary indication mode SIM becomes the cancellation of the selection. That is, the selected bits are cancelled in a period of 6 bits, the selection of the bitstream is cancelled in a period of 12 bits corresponding to a product ($prid_1 * prid_2$) of the primary indication parameter and the secondary indication parameter.

Referring to FIG. 3, the indexes of the bits selected using the primary indication parameter are 0, 2, 4, 6, 8, 10, 12, 14, ..., and 122. That is, since the total number of bits selected is 62 and is larger than the necessary target bit number, the selection should be cancelled using the secondary indication parameter. At this time, the indexes of the bits cancelled using the secondary indication parameter include 11 indexes of 0, 12, 24, ..., and 120. Accordingly, the target bits which are finally selected are hatched bits shown in the upper side of the FIG. 3. The indexes of the target bits include 51 indexes of 2, 4, 6, 8, 10, 14, ..., and 122.

Since the rate matching mode according to the present embodiment is the puncturing mode, the output bitstream is shown in the lower side of FIG. 3 if the selected target bits are punctured. The indexes of the bits of the output bitstream are 0, 1, 3, 5, 7, 9, 11, 12, ..., and 121. It can be seen that the number of bits of the output bitstream is 72 and the rate matching is accurately performed.

Figure 4:
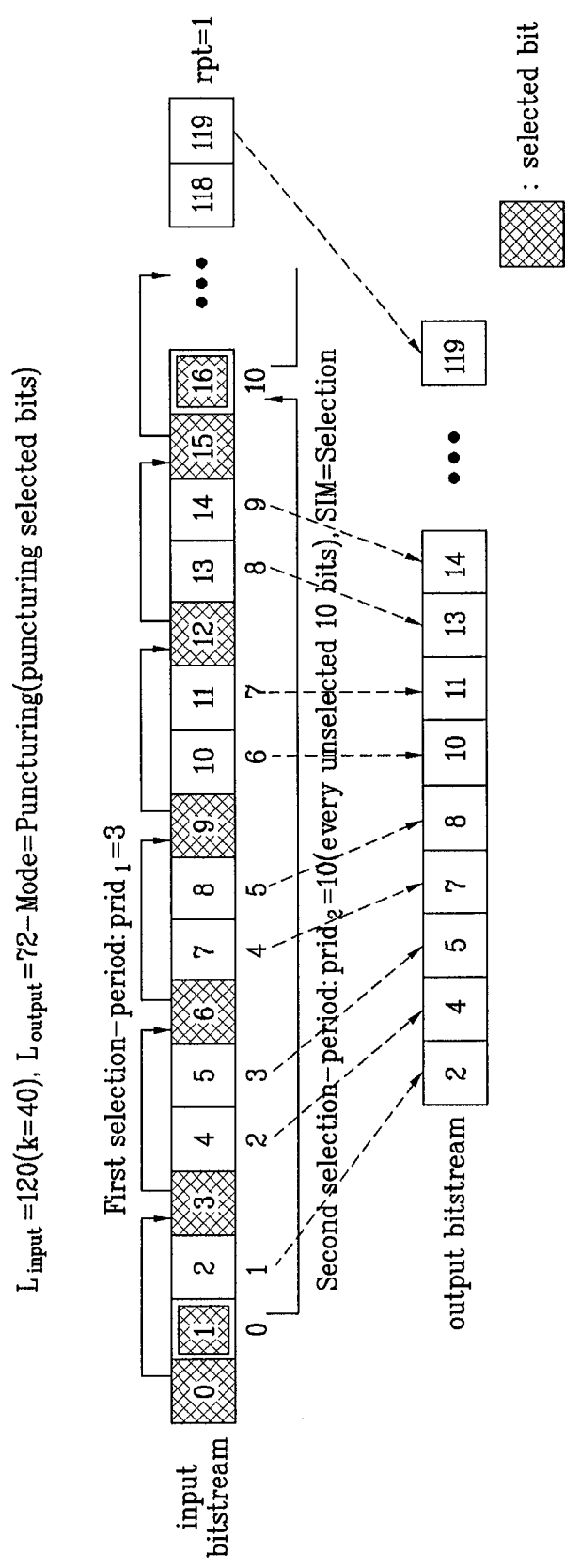
FIG. 4 is a view showing an example of a method of selecting target bits according to an embodiment of the present invention.

FIG. 4 is a view showing an example of a method of selecting target bits according to an embodiment of the present invention.

FIG. 4 shows a method of selecting the target bits which will be used to perform the rate matching in the case where the information bit number is 40, the input bit number $L_{input}$ is 120 (=40*3), and the output bit number $L_{output}$ is 72.

From the above-described parameter values, since the input bit number is larger than the output bit number, the rate matching mode is the puncturing mode. The target bit number $n_{select}$ is a difference between the input bit number and the output bit number ($L_{input}-L_{output}$) of 48. Since the primary indication parameter $prid_1$ becomes $$3 \left( = \left\lceil \frac{120}{48} \right\rceil \right)$$

according to $$\left\lceil \frac{L_{input}}{n_{select}} \right\rceil, temp1 = 120 - \lfloor 120/3 \rfloor = 80 \text{ and } temp2 = 48 - \lfloor 120/3 \rfloor = 8,$$

the secondary indication parameter $prid_2$ becomes $$\lfloor 80/8 \rfloor = 10.$$

Since the value temp2 is larger than 0, the secondary indication mode SIM becomes the additional selection. That is, the bits are selected from the unselected bits in a period of 10.

Referring to FIG. 4, the indexes of the bits selected using the primary indication parameter are 0, 3, 6, 9, 12, 15, ..., and 117. That is, since the total number of bits selected is 40 and is smaller than the necessary target bit number, the bits are additionally selected using the secondary indication parameter. At this time, the indexes of the bits selected using the secondary indication parameter include eight indexes of 1, 16, ..., and 106. Accordingly, the target bits which are finally selected are hatched bits shown in the upper side of the FIG. 4. The indexes of the target bits include total 48 indexes of 0, 1, 3, 6, ..., and 117.

Since the rate matching mode according to the present embodiment is the puncturing mode, the output bitstream is shown in the lower side of FIG. 4 if the selected target bits are punctured. The indexes of the bits of the output bitstream are 2, 4, 5, 7, 8, 10, 11, 13, 14, ..., and 119. It can be seen that the number of bits of the output bitstream is 72 and the rate matching is accurately performed.

Figure 5:
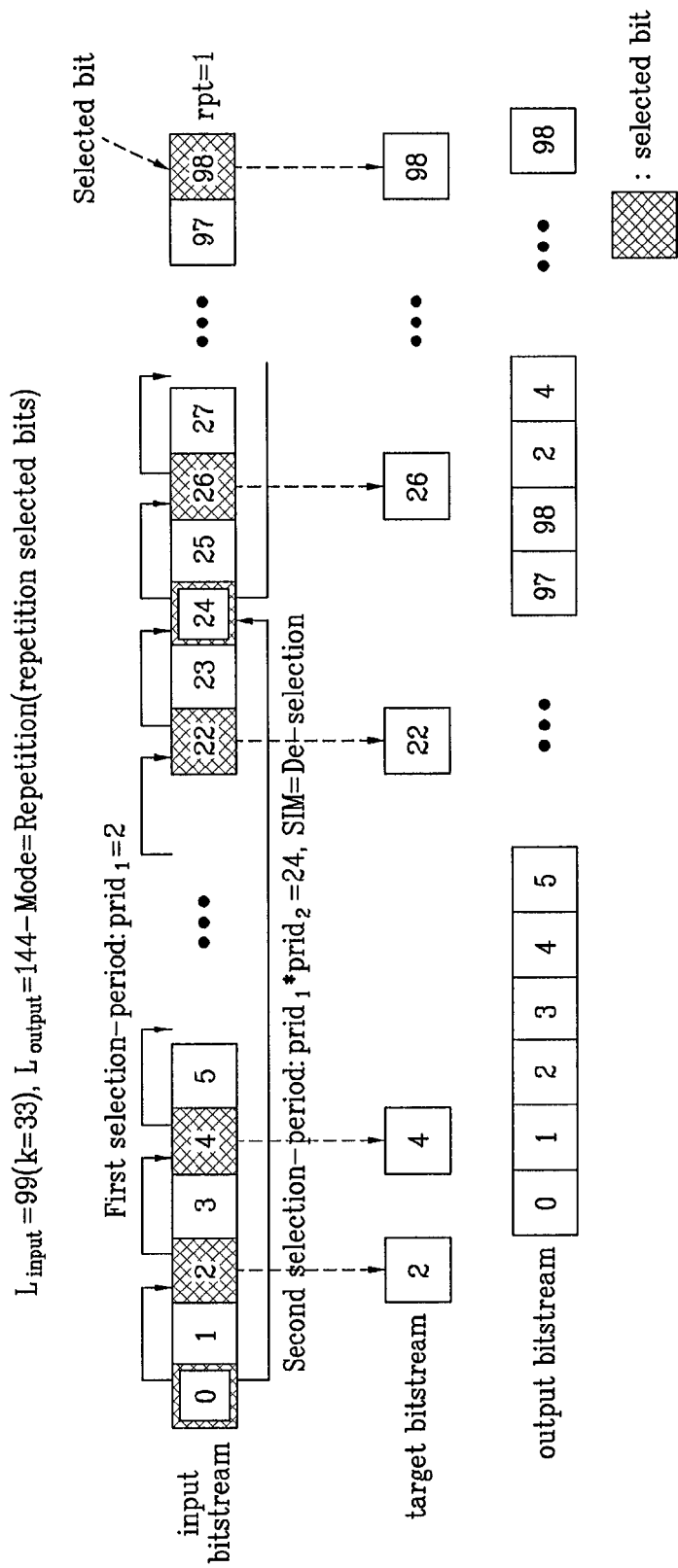
FIG. 5 is a view showing an example of a method of selecting target bits according to an embodiment of the present invention.

FIG. 5 is a view showing an example of a method of selecting target bits according to an embodiment of the present invention.

FIG. 5 shows a method of selecting the target bits which will be used to perform the rate matching in the case where the information bit number is 33, the input bit number $L_{input}$ is 99 (=33*3), and the output bit number $L_{output}$ is 144.

From the above-described parameter values, since the input bit number is smaller than the output bit number, the rate matching mode is the repetition mode. The number of times of whole repetition (rpt) is 1 and the target bit number $n_{select}$ is a difference between the input bit number and the output bit number of 45. Since the primary indication parameter $prid_1$ becomes $$2 \left( = \left\lceil \frac{99}{45} \right\rceil \right)$$

according to $$\left\lceil \frac{L_{input}}{n_{select}} \right\rceil, temp1 = 99 - \lfloor 99/2 \rfloor = 50 \text{ and } temp2 = 45 - \lfloor 99/2 \rfloor = -4,$$

the secondary indication parameter $prid_2$ becomes $$\lfloor 50/4 \rfloor = 12.$$

Since the value temp2 is smaller than 0, the secondary indication mode SIM becomes the cancellation of the selection. That is, since some of the selected bits are cancelled in a period of 12 bits, the selection of the input bitstream is cancelled in a period of 24 bits corresponding to a product of the primary indication parameter and the secondary indication parameter.

Referring to FIG. 5, the indexes of the bits selected using the primary indication parameter are 0, 2, 4, ..., and 98. That is, since the total number of bits selected is 50 and is larger than the necessary target bit number, the selection is cancelled using the secondary indication parameter. At this time, the indexes of the bits selected using the secondary indication parameter include five indexes of 0, 24, ..., and 96. Accordingly, the target bits which are finally selected are hatched bits shown in the upper side of the FIG. 5. The indexes of the target bits include total 45 indexes of 2, 4, ..., and 98.

Since the rate matching mode according to the present embodiment is the repetition mode, the output bitstream is shown in the lower side of FIG. 5 if the selected target bits are repeated. The indexes of the bits of the output bitstream include all the bits from 0 to 98 and further include additional bits of 2, 4, . . . , and 98. It can be seen that the number of bits of the output bitstream is 144 and the rate matching is accurately performed.

It will be apparent that an embodiment may be configured by a combination of claims cited by each other and a new claim may be included by the amendment after the application.

The embodiments of the present invention may be implemented by hardware, firmware, software and a combination thereof. In the implementation of the hardware, the rate matching method according to one embodiment of the present invention may be implemented by one of application specific integrated circuits (ASICs), digital signal processors (DSPs), digital signal processing devices (DSPDs), programmable logic devices (PLDs), field programmable gate arrays (FPGAs), processors, controllers, microcontrollers or microprocessors.

In the implementation of the firmware or software, the rate matching method according to one embodiment of the present invention may be implemented by modules, procedures or functions for performing the above-described functions or operations. A software code may be stored in a memory unit and operated by a processor. The memory unit may be located inside or outside the processor so as to exchange data with the processor by various known units.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

The present invention is applicable to a communication system and more particularly a rate matching method in a mobile communication system.

The invention claimed is:

1. A rate matching method for generating an output bitstream of $L_o$ symbols from an input bitstream of $L_i$ symbols, comprising:

selecting bits from an input bitstream using a selection period of a primary indication parameter for selecting at least one bit and a selection period of a secondary indication parameter for canceling the selection using the primary indication parameter or additionally selecting unselected bits; and processing the selected bits according to a rate matching mode so as to generate an output bitstream, wherein the primary indication parameter, $prid_1$, is defined as a minimum integer equal or larger than $Li/n_{select}$, where $L_i$ is a number of symbols of the input bitstream, $L_o$ is a number of symbols of the output bitstream and $n_{selected}$ is a target bit number, defined as absolute value of $L_i - L_o$, wherein the second indication parameter, $prid_2$, is defined as $temp_1/temp_2$, where $temp_1$ is defined as $L_i - [L_i/prid_1]$ and $temp_2$ is defined as $n_{select} - [L_i - prid_1]$, wherein $[x]$ is a maximum integer equal or smaller than x, and wherein the primary indication parameter and the secondary indication parameter indicate selection periods, the $temp_1$ indicates a number of unselected symbols by the primary indication parameter, and the $temp_2$ indicates a number of symbols to be selected by the secondary indication parameter.

2. The rate matching method according to claim 1, wherein a secondary indication mode is used to indicate one of the selection of the bits and the cancellation of the selection using the secondary indication parameter.

3. The rate matching method according to claim 1, wherein the rate matching mode is a puncturing mode if the size of the input bitstream is larger than that of the output bitstream and is a repetition mode if the size of the input bitstream is smaller than that of the output bitstream.

* * * * *